US011374132B2

(12) United States Patent
Smith (10) Patent No.: US 11,374,132 B2
(45) Date of Patent: Jun. 28, 2022

(54) ELECTRONIC DEVICES INCLUDING CAPACITORS WITH MULTIPLE DIELECTRIC MATERIALS, AND RELATED SYSTEMS

(71) Applicant: Micron Technology, Inc., Boise, ID (US)

(72) Inventor: Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/087,842

(22) Filed: Nov. 3, 2020

(65) Prior Publication Data
US 2021/0074864 A1 Mar. 11, 2021

Related U.S. Application Data

(62) Division of application No. 16/215,929, filed on Dec. 11, 2018, now Pat. No. 10,833,206.

(51) Int. Cl.
*H01L 29/94* (2006.01)
*G11C 16/30* (2006.01)
(Continued)

(52) U.S. Cl.
CPC .............. *H01L 29/94* (2013.01); *G11C 16/30* (2013.01); *H01L 21/28061* (2013.01);
(Continued)

(58) Field of Classification Search
CPC .................. H01L 29/94; H01L 29/4933; H01L 29/66181; H01L 21/28061; H01L 27/11526; H01L 27/11573; H01L 27/0805
See application file for complete search history.

(56) References Cited

U.S. PATENT DOCUMENTS 4,471,368 A 9/1984 Mohsen
6,211,008 B1 4/2001 Yu et al.
(Continued)

FOREIGN PATENT DOCUMENTS

CN 1252619 A 5/2000
CN 103199093 A 7/2013
(Continued)

OTHER PUBLICATIONS

International Search Report from International Application No. PCT/US2019/058889, dated Feb. 21, 2020, 3 pages.
(Continued)

*Primary Examiner* — Sultana Begum
(74) *Attorney, Agent, or Firm* — TraskBritt (57) ABSTRACT

A semiconductor structure includes a capacitor structure comprising an active region comprising opposing field edges parallel to a first horizontal direction and a gate region comprising opposing gate edges parallel to a second horizontal direction transverse to the first horizontal direction. The semiconductor structure also comprises a first dielectric material adjacent at least one of the opposing field edges or the opposing gate edges and a second dielectric material adjacent the active area and abutting portions of the first dielectric material. A height of the second dielectric material in a vertical direction may be less than the height of the first dielectric material. Semiconductor devices and related methods are also disclosed.

20 Claims, 6 Drawing Sheets

(51) Int. Cl.
  *H01L 29/49* (2006.01)
  *H01L 21/28* (2006.01)
  *H01L 27/11526* (2017.01)
  *H01L 27/11573* (2017.01)
  *H01L 29/66* (2006.01)
  *G11C 16/04* (2006.01)

(52) U.S. Cl.
  CPC .. *H01L 27/11526* (2013.01); *H01L 27/11573* (2013.01); *H01L 29/4933* (2013.01); *H01L 29/66181* (2013.01); *G11C 16/0483* (2013.01)

(56) References Cited

U.S. PATENT DOCUMENTS

| | | | |
|---|---|---|---|
| 6,376,296 | B2 | 4/2002 | Tung |
| 6,448,852 | B1 | 9/2002 | Compton et al. |
| 8,507,347 | B2 | 8/2013 | Schulz |
| 8,673,734 | B2 | 3/2014 | Park |
| 8,680,650 | B2 | 3/2014 | Freeman |
| 2002/0025622 | A1 | 2/2002 | Schrems et al. |
| 2006/0189063 | A1 | 8/2006 | Hueting et al. |
| 2007/0267693 | A1 | 11/2007 | Chien et al. |
| 2009/0072308 | A1 | 3/2009 | Chen et al. |
| 2010/0102382 | A1 | 4/2010 | Shimada et al. |
| 2010/0264478 | A1 | 10/2010 | Rossi et al. |
| 2010/0270614 | A1 | 10/2010 | Croce et al. |
| 2013/0075683 | A1 | 3/2013 | Fowler et al. |
| 2013/0175590 | A1* | 7/2013 | Kim .................. H01L 27/0629 257/296 |
| 2014/0146598 | A1 | 5/2014 | Sandhu et al. |
| 2015/0325572 | A1 | 11/2015 | Cheng et al. |
| 2016/0225795 | A1 | 8/2016 | Koezuka et al. |
| 2018/0068947 | A1 | 3/2018 | Ishikawa |
| 2018/0122815 | A1 | 5/2018 | Chang et al. |
| 2018/0315661 | A1 | 11/2018 | Chuang et al. |
| 2020/0135844 | A1* | 4/2020 | Takahashi ........... H01L 23/5223 |

FOREIGN PATENT DOCUMENTS

| | | |
|---|---|---|
| JP | 2003-309182 A | 10/2003 |
| JP | 2004-296594 A | 10/2004 |
| JP | 2005-012104 A | 1/2005 |
| JP | 2013-143568 A | 7/2013 |
| JP | 2015-118972 A | 6/2015 |
| KR | 10-2013-0081505 A | 7/2013 |
| TW | 201330274 A | 7/2013 |
| TW | 201543492 A | 11/2015 |
| TW | 201639174 A | 11/2016 |
| TW | 201701362 A | 1/2017 |
| TW | 201729392 A | 8/2017 |

OTHER PUBLICATIONS

International Written Opinion from International Application No. PCT/US2019/058889, dated Feb. 21, 2020, 6 pages.
Taiwan Office Action for Application No. 108140920, dated Aug. 25, 2020, 20 pages.
Chinese First Office Action for Application No. 201980082361.6, dated Oct. 27, 2021, 8 pages.
Japanese First Office Action for Application No. 2021-533237, dated Nov. 30, 2021, 6 pages.
Korean First Office Action for Application No. 10-2021-7021618, dated Oct. 30, 2021, 14 pages.
Taiwanese First Office Action for Application No. 110106705, dated Dec. 7, 2021, 6 pages.

* cited by examiner

FIG. 4

ELECTRONIC DEVICES INCLUDING CAPACITORS WITH MULTIPLE DIELECTRIC MATERIALS, AND RELATED SYSTEMS

CROSS-REFERENCE TO RELATED APPLICATION

This application is a divisional of U.S. patent application Ser. No. 16/215,929, filed Dec. 11, 2018, now U.S. Pat. No. 10,833,206, issued Nov. 10, 2020, the disclosure of which is hereby incorporated herein in its entirety by this reference.

TECHNICAL FIELD

Embodiments of the disclosure relate to the field of semiconductor device design and fabrication. More specifically, embodiments of the disclosure relate to semiconductor structures including capacitor structures, and to related semiconductor devices and methods.

BACKGROUND

Semiconductor device designers often desire to increase the level of integration, which may also be characterized as density, of features within a semiconductor device by reducing the dimensions of the individual features and by reducing the distance between neighboring features. In addition, semiconductor device designers often desire to design architectures that are not only compact, but offer performance advantages, as well as simplified designs. A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to implement vertical memory array (also referred to as a "three-dimensional (3D) memory array") architectures. In such memory devices, capacitors are used in various types of peripheral circuits such as charge pump circuits, sense amplifiers and the like. These capacitors are formed as metal-oxide semiconductor (MOS) capacitors or well capacitors above a semiconductor substrate by the same process as that used to form transistors used in other circuits.

As the performance and complexity of electronic systems increase, the requirement for additional memory and memory density in a system also increases. As a thickness of a dielectric material is further scaled down to facilitate increased device density, decreased reliability becomes increasingly problematic. In particular, decreasing the thickness of the dielectric material used in "high-stress" circuits may result in dielectric breakdown. The thinner the dielectric material, the lower the stress it can sustain for a given surface area. In a NAND device, many different kinds of charge pump circuits are required to provide different internally generated voltage levels. These charge pump circuits usually are equipped with several different sized charge pump circuit capacitors including so-called "low-voltage" or "super low-voltage" dielectric materials. When the number of the charge pump circuits is increased, and the size of the charge pump circuit capacitors used in the charge pump circuits decreases, the reliability of the capacitor dielectric becomes a concern, especially for those capacitors operated at relatively high voltage levels.

DETAILED DESCRIPTION

As discussed in further detail below, in some embodiments, the present disclosure includes capacitor structures for semiconductor devices, such as NAND devices. The capacitor structures may have optimized (e.g., increased) regions of dielectric material (e.g., oxide material) exhibiting increased resistance in comparison to conventional capacitor structures and may include one or more regions having differing thicknesses of the dielectric materials. Such capacitor structures may be tailored to withstand increased voltages utilized, for example, in peripheral circuits and charge pump circuits of a NAND memory device. Each of the capacitor structures may include a first dielectric material (e.g., a low-voltage or "LV" dielectric material) overlying a peripheral region of an active area and a second dielectric material (e.g., a super low-voltage or "SLV" dielectric material) overlying a central region of the active area of the capacitor structure. The second dielectric material may have a thickness that is less than that of the first dielectric material, such that a resistance of the second dielectric material is relatively lower than that of the first dielectric material. The differing thickness of the dielectric materials may be selected responsive to a dielectric constant thereof and a desired applied voltage the capacitor structure must withstand. In addition, opposing gate edges of a gate and/or opposing field edges of the active area may be self-aligned with the underlying dielectric materials. Such a capacitor structure may be used in, for example, a charge pump circuit or other peripheral circuits of a NAND memory device, which will be discussed in further detail below. In other embodiments, the present disclosure includes a semiconductor device including capacitor structures and methods of forming such semiconductor devices.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "pitch" refers to the distance between identical points in two adjacent (i.e., neighboring) features.

As used herein, the term "selectively etchable" means and includes a material that exhibits a greater etch rate responsive to exposure to a given etch chemistry relative to another material exposed to the same etch chemistry. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1A:
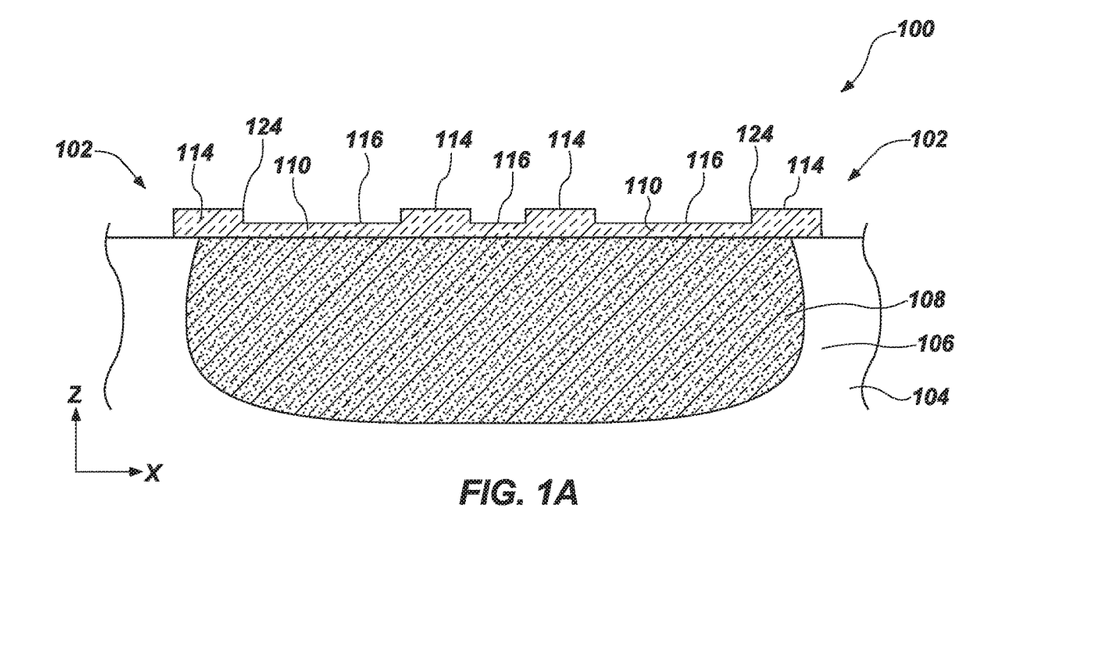
FIGS. 1A and 1C are simplified, partial cross-sectional views showing various stages of fabrication of a semiconductor structure of a semiconductor device in accordance with embodiments of the disclosure.
Figure 1B:
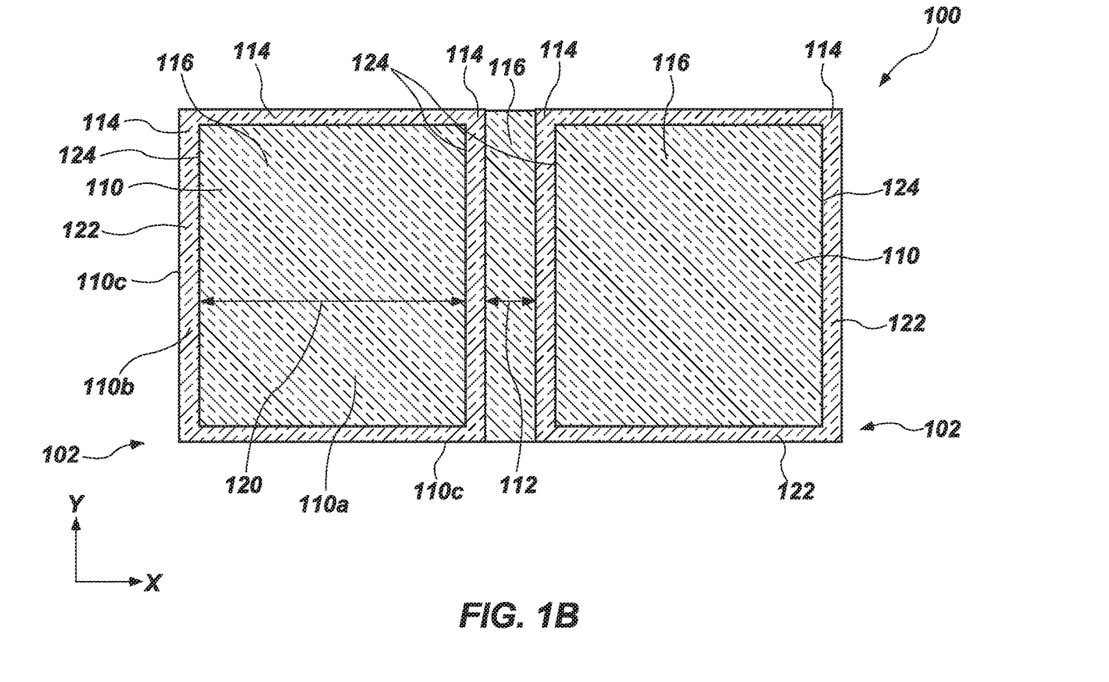
FIGS. 1B and 1D are top down views showing various stages of fabrication of the semiconductor structure of the semiconductor device in accordance with embodiments of the disclosure.

A semiconductor structure 100 including one or more (e.g., two) capacitor structures 102 is shown in FIGS. 1A and 1B. The capacitor structures 102 may be formed adjacent (e.g., on or over) a base material 104 (e.g., a substrate). The base material 104 may be a semiconductor substrate, a base semiconductor layer on a supporting structure, a metal electrode or a semiconductor substrate having one or more layers, structures or regions formed thereon. The base material 104 may include, for example, silicon-on-insulator (SOI) type substrates, silicon-on-sapphire (SOS) type substrates, or epitaxial layers of silicon supported by a layer of base material. In addition, the base material 104 may include multiple portions that support and/or isolate one or more conductive materials and insulative materials for routing signals to and/or from electrically conductive materials. For example, the base material 104 may include one or more conductive materials where circuitry (e.g., control units) and/or interconnections are provided for routing the signals. Further, the base material 104 may be undoped, or may include a p-type dopant or an n-type dopant. For example, a portion of the base material 104 may include a p-doped region 106 including a p-type conductivity material and an n-well region 108 including an n-type conductivity material located within the p-doped region 106. Alternatively, the base material 104 may include a p-well region located within a region having an n-type conductivity material. The capacitor structures 102 may be positioned with portions thereof overlying at least a portion of the n-well region 108 of the base material 104. While two capacitor structures 102 are shown for clarity, any number of capacitor structures 102 may be formed in a repeating pattern (e.g., an array). Individual capacitor structures 102 may include an active region 110 including a central region 110a, a peripheral region 110b, and edges 110c. The active region 110 may be defined by the edges 110c on the top and bottom parallel to a first horizontal direction X and by the edges 110c on opposing sides parallel to a second horizontal direction Y transverse (e.g., perpendicular) to the first horizontal direction X, as shown in the top down view of FIG. 1B. While the active region 110 of the capacitor structures 102 is shown as having a substantially rectangular cross-sectional shape, the active region 110 may have any suitable transverse to cross-sectional shape such as, for example, a circular cross-sectional shape, a square cross-sectional shape, an elliptical cross-sectional shape, or a triangular cross-sectional shape. Adjacent capacitor structures 102 may be spaced apart by an intermediary region 112 (e.g., a gap), as shown in FIG. 1B.

One or more dielectric materials are formed overlying and/or proximal to the active region 110. For example, a first dielectric material 114 and a second dielectric material 116 may be formed adjacent one another with portions thereof overlying at least a portion of the active region 110. The first dielectric material 114 and the second dielectric material 116 may include, but are not limited to, an oxide or a nitride. The dielectric materials may be formed and patterned by conventional techniques to form the first dielectric material 114 and the second dielectric material 116. Further, at least portions of the first dielectric material 114 and the second dielectric material 116 are located above the n-well region 108 of the base material 104, as shown in the simplified, partial cross-sectional view of FIG. 1A. In some embodiments, the first dielectric material 114 is formed overlying the peripheral region 110b of the active region 110 and the second dielectric material 116 is formed overlying the central region 110a of the active region 110 of individual capacitor structures 102. For example, the second dielectric material 116 may be formed in openings 120 proximal to (e.g., directly over) the central region 110a without being formed in blocked regions 122 in the peripheral region 110b, while the first dielectric material 114 may be formed proximal to (e.g., directly over) the peripheral region 110b of the active region 110, as described in greater detail below. The openings 120 are formed by conventional techniques at locations of the base material 104 where the second dielectric material 116 is ultimately to be formed. As shown in each of the cross-sectional view and top down view, the first dielectric material 114 may be positioned to abut (e.g., be in direct physical contact with) the second dielectric material 116 along one or more interfaces 124. While the interfaces 124 are shown in the cross-sectional view as substantially straight, vertical lines, the interfaces 124 may also be configured to include sloped, undercut, or otherwise varied portions.

The first dielectric material 114 may be formed adjacent to and in contact (e.g., direct physical contact) with an upper surface of the active region 110. The first dielectric material 114 may be formed by a conventional deposition process, such as by chemical vapor deposition (CVD) or atomic layer deposition (ALD). Alternatively, the first dielectric material 114 may be formed by blanket coating or may be grown on the surface of the active region 110. In some embodiments, the first dielectric material 114 may be formed overlying the peripheral region 110b without being formed overlying the central region 110a of the active region 110. For example, an inner lateral surface of the first dielectric material 114 may abut against an outer lateral surface of the second dielectric material 116 along the interface 124, which interface 124 extends along and defines a boundary between the central region 110a and the peripheral region 110b. In some embodiments, outer surfaces of the first dielectric material 114 may be vertically aligned with at least some (e.g., all) of the edges 110c of the active region 110. In other embodiments, the outer surfaces of the first dielectric material 114 may cover and extend over (e.g., farther than) the edges 110c. In such embodiments, portions of the first dielectric material 114 may overlie at least a portion of the intermediary region 112. In yet other embodiments, the outer surfaces of the first dielectric material 114 may not fully cover the peripheral region 110b such that at least some of the outer surfaces of the first dielectric material 114 are located internal to the edges 110c without overlying any of the intermediary region 112.

In the embodiment shown in FIGS. 1A and 1B, placement of the first dielectric material 114 may be characterized as a so-called "narrow ridge" of dielectric material. For example, the narrow ridge of the first dielectric material 114 may include a thickness (e.g., height) in the vertical direction Z that is relatively greater than a width in one or more of the first horizontal direction X and the second horizontal direction Y, such that the relatively thicker dielectric material of the first dielectric material 114 is located to surround (e.g., fully surround) the central region 110a of the relatively thinner dielectric material of the second dielectric material 116. Stated another way, the first dielectric material 114 may be formed on each of the edges 110c (e.g., all four sides) of the active region 110, as shown most clearly in FIG. 1B. Alternatively, the first dielectric material 114 may be formed on only some of the edges 110c (e.g., one, two, or three sides or portions thereof) of the active region 110. For example, the first dielectric material 114 may be formed only along two opposing sides as described in greater detail below. In such embodiments, the second dielectric material 116 may be formed adjacent any remaining edges 110c. One of ordinary skill in the art will appreciate that the first dielectric material 114 may be selectively positioned to achieve the desired resistance requirements while minimizing reduction of capacitance.

The first dielectric material 114 is selected to function as a so-called "low-voltage" dielectric material. For example, the first dielectric material 114 may be a silicon oxide ($SiO_x$) material. As a non-limiting example, the first dielectric material 114 may include silicon dioxide ($SiO_2$), tantalum pentoxide ($Ta_2O_5$), silicon nitride ($Si_3N_4$), hafnium oxide ($HfO_2$), aluminum oxide ($Al_2O_3$). In some embodiments, the first dielectric material 114 is silicon dioxide ($SiO_2$).

Dimensions (e.g., thicknesses) of the first dielectric material 114 may be determined according to a dielectric constant thereof and an applied voltage of the fully formed semiconductor structure 100. The first dielectric material 114 has a height in a vertical direction Z transverse (e.g., perpendicular) to the first horizontal direction X and the second horizontal direction Y, as shown in FIG. 1A. Dimensions of the first dielectric material 114 may be sufficient to operate as the low-voltage dielectric material. The dimensions of the first dielectric material 114 may be determined by resistance requirements of the capacitor structures 102 and such dimensions may be scalable by adjusting (e.g., increasing, decreasing) a thickness (e.g., height) at which the first dielectric material 114 is formed. By way of example only, the first dielectric material 114 may be formed at a thickness (e.g., height) of from about 50 Å to about 70 Å, such as about 54 Å or about 64 Å. A length and width of the first dielectric material 114 may also be determined by resistance requirements of the capacitor structures.

The second dielectric material 116 may be formed adjacent to and in contact (e.g., direct physical contact) with an upper surface of the active region 110. The second dielectric material 116 may be formed by a conventional deposition process, such as by chemical vapor deposition (CVD) or atomic layer deposition (ALD). Alternatively, the second dielectric material 116 may also be formed by blanket coating or may be grown on the surface of the active region 110. In some embodiments, the second dielectric material 116 may be formed overlying the central region 110a without being formed overlying the peripheral region 110b and without contacting the edges 110c of the active region 110. For example, an outer surface of the second dielectric material 116 may abut against an inner surface of the first dielectric material 114 along the interface 124, which in some embodiments coincides with the interface between the central region 110a and the peripheral region 110b.

The second dielectric material 116 is selected to function as a so-called "super low-voltage" dielectric material. Further, the second dielectric material 116 may be the same material as or a different material from the first dielectric material 114. For example, the second dielectric material 116 may be a silicon oxide ($SiO_x$) material. As a non-limiting example, the second dielectric material 116 may include silicon dioxide (Sift), tantalum pentoxide ($Ta_2O_5$), silicon nitride ($Si_3N_4$), hafnium oxide ($HfO_2$), aluminum oxide ($Al_2O_3$). In some embodiments, the second dielectric material 116 is silicon dioxide ($SiO_2$).

Dimensions (e.g., thicknesses) of the second dielectric material 116 may be determined according to a dielectric constant thereof and an applied voltage of the fully formed semiconductor structure 100. The second dielectric material 116 also has a height in the vertical direction Z transverse to the first horizontal direction X and the second horizontal direction Y. A thickness (e.g., height) of the second dielectric material 116 may differ from a thickness of the first dielectric material 114. For example, the second dielectric material 116 may be formed at a lessor relative thickness than the first dielectric material 114. In some embodiments the thickness of the second dielectric material 116 may be about one-half of that of the first dielectric material 114. If the same materials are used, the first dielectric material 114 and the second dielectric material 116 may differ from one another (e.g., only) by thickness, with a boundary therebetween being defined by the interface 124. Dimensions of the second dielectric material 116 may be sufficient to operate as the super low-voltage dielectric material. The dimensions of the second dielectric material 116 may be determined by resistance requirements of the capacitor structures 102 and such dimensions may be scalable by adjusting (e.g., increasing, decreasing) a thickness (e.g., height) at which the second dielectric material 116 is formed. By way of example only, the second dielectric material 116 may be formed at a thickness (e.g., height) of from about 20 Å to about 45 Å, such as about 27 Å (e.g., 1.2V oxide) or about 34 Å. Thus, a threshold voltage magnitude of the second dielectric material 116 may be lower than a threshold voltage magnitude of the first dielectric material 114. An area of the second dielectric material 116 may also be determined by resistance requirements of the capacitor structures.

Optionally, one or more additional dielectric materials (not shown) may be formed (e.g., blanket coated, deposited, or grown) within a circuit including the semiconductor structure 100. Such additional dielectric materials may be selected to function as so-called "high-voltage" dielectric materials. In some embodiments, the additional dielectric materials may be the same material or a different material from the first dielectric material 114 and the second dielectric material 116 (e.g., an oxide or a nitride). Locations and dimensions (e.g., thicknesses) of the additional dielectric materials may be determined according to a dielectric constant thereof and an applied voltage of the fully formed semiconductor structure 100. For example, the additional dielectric materials may be formed at a greater relative thickness than each of the first dielectric material 114 and the second dielectric material 116. In embodiments where the additional dielectric materials are formed, in addition to the first dielectric material 114 and the second dielectric material 116, the capacitor structures 102 may be formed by a so-called "triple-oxide" process. In other embodiments where only the first and second dielectric materials 114, 116 are formed, the capacitor structures 102 may be formed by a so-called "dual-oxide" process. Alternatively, the semiconductor structure 100 may be formed using a process with any number of dielectric materials.

The first dielectric material 114 may be formed (e.g., grown) in designated regions of the semiconductor structure 100. Thereafter, portions of the first dielectric material 114 may be removed (e.g., etched away) in locations designated to contain the second dielectric material 116, such as the central region 110a of the active region 110, for example.

Thereafter, the second dielectric material 116 may be formed (e.g., grown) in the designated regions. Alternatively, the first dielectric material 114 and/or the second dielectric material 116 may be formed and patterned on the active region 110 using a mask material (not shown). For example, a mask material (e.g., resist) may be formed (e.g., deposited) above the peripheral region 110b of the active region 110 prior to forming the first dielectric material 114 and subsequently removed following the removal process of the first dielectric material 114 and prior to forming the second dielectric material 116. In some embodiments, the mask material may be located within the peripheral region 110b and may be spaced from about 200 nm to about 500 nm inward from the edges 110c of the active region 110. By way of non-limiting example, the mask material may be spaced about 325 nm inward from the edges 110c of the active region 110. In some embodiments, the first dielectric material 114 and the second dielectric material 116 may be formed as described above. Alternatively, the second dielectric material 116 may be formed prior to forming the first dielectric material 114. In such embodiments, each of the second dielectric material 116 and the first dielectric material 114 may be formed (e.g., grown) in respective designated locations. In other embodiments, the second dielectric material 116 may be formed adjacent all (e.g., both) designated regions with the first dielectric material 114 being formed adjacent to and in contact with the second dielectric material 116 in specified regions such that the combined thicknesses of the materials in their final state are similar to that achieved in the previous embodiment. In yet other embodiments, the first dielectric material 114 and the second dielectric material 116 may be formed at substantially the same time. In such embodiments, an initial thickness of each of the first dielectric material 114 and the second dielectric material 116 may be substantially the same and, thereafter, portions of the second dielectric material 116 may be removed by conventional techniques (e.g., wet or dry etching) to achieve the differing thicknesses in their final state.

As a result, the combination of the varied (e.g., differing) thicknesses of the first dielectric material 114 and the second dielectric material 116 overlying and/or proximal to the active region 110 provides an optimized thickness of dielectric materials such that leakage along the edges 110c is reduced (e.g., minimized) and reliability of the semiconductor structure 100 is improved. FIGS. 1A and 1B are simplified, partial cross-sectional and top down views of the semiconductor structure 100 following formation of the first dielectric material 114 and the second dielectric material 116. As described below, the resulting profile of the semiconductor structure 100 allows appropriate placement of gate materials (see FIGS. 1C and 1D) subsequently formed on the combined profile (e.g., topography) of the dielectric materials.

Figure 1C:
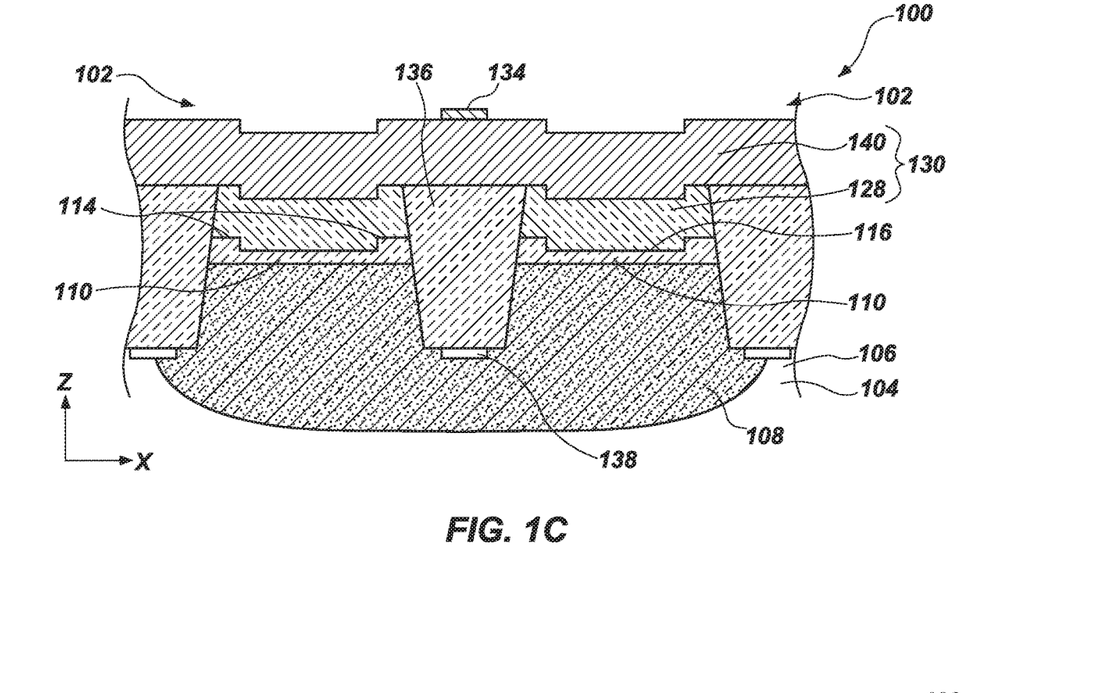
Figure 1D:
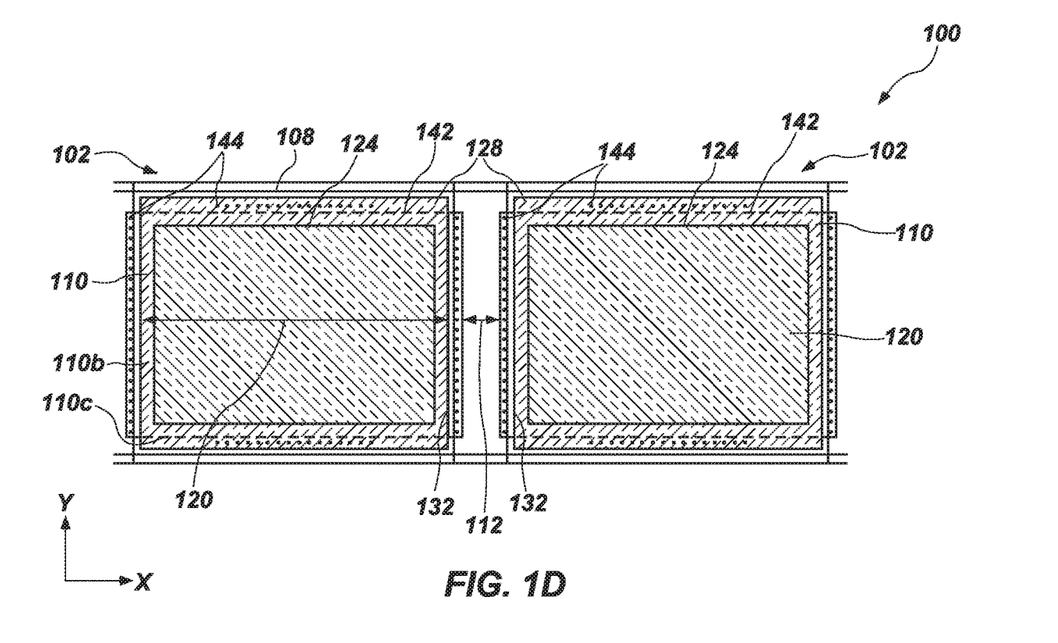

As shown in FIGS. 1C and 1D, a semiconductor material 128 is formed adjacent to and in contact (e.g., direct physical contact) with the first and second dielectric materials 114, 116 of the capacitor structures 102 of the semiconductor structure 100. The semiconductor material 128 may include, but is not limited to, polysilicon. A conductive material 140, such as a metal-containing material (e.g., a tungsten-containing material) or other conventional material, is formed adjacent to and in contact with the semiconductor material 128, forming a gate region 130. The gate region 130 may also include a gate electrode 134. As shown in the cross-sectional view of FIG. 1C, isolation regions 136 are formed in the base material 104. The isolation regions 136 may be so-called "shallow trench isolation" (STI) structures, for example. In some embodiments, the isolation regions 136 may be formed after formation of the semiconductor material 128 and prior to formation of the conductive material 140. The isolation regions 136 are positioned laterally between adjacent capacitor structures 102, for example, proximal to (e.g., directly adjacent) the first dielectric material 114 of adjacent capacitor structures 102 and underlying portions of the intermediary region 112 extending therebetween. In some embodiments, the isolation regions 136 may fully replace portions of the first dielectric material 114. The isolation regions 136 may be used to electrically isolate regions of individual capacitor structures 102 from regions of adjacent capacitor structures 102 and/or from other devices (e.g., transistors). Further, contacts 144 may be located proximal to and/or extending through the active region 110 and/or the gate region 130. The contacts 144 are formed by conventional techniques. In some embodiments, source/drain regions (not shown) may be formed in a portion of the base material 104 in regions proximal to respective capacitor structures 102 external to the gate region 130. In embodiments where the base material 104 includes the n-well region 108 within the p-doped region 106, one or both of the source/drain regions may include a concentration of an n-type conductivity material (e.g., n+ doped) that is relatively higher in concentration than that of the n-well region 108 to create a low resistance connection between the contacts 144 and the base material 104. In some embodiments, a region 138 may extend below a lower surface of at least some of the isolation regions 136. The region 138 may be a product of processing techniques (e.g., dry etching) during formation of the dielectric materials, as shown in the embodiment of FIGS. 1A and 1B. For example, the region 138 may comprise a recess in the lower surface of openings (e.g., trenches) of the isolation regions 136, which recess may be due, at least in part, to topography of the overlying layers (e.g., the first dielectric material 114 and the second dielectric material 116) that has been translated downward to the lower surface of at least some of the openings during formation of the isolation regions 136. Put another way, the region 138 may be slightly recessed relative to adjacent portions of the lower surface of the isolation regions 136 as a result of the second dielectric material 116 being slightly recessed relative to adjacent portions of the first dielectric material 114 adjacent the intermediary region 112, as shown in FIGS. 1A and 1B.

The semiconductor material 128 may include a semiconductor material, such as one or more of silicon germanium, germanium, and polycrystalline silicon (also known as "polysilicon"). The conductive material 140 may include, but is not limited to, a tungsten-containing material, a titanium-containing material, or a combination thereof. The conductive material 140 may, for example, include a silicided metal material, such as a silicided tungsten (WSi$_x$) material, or a metal material, such as tungsten, hafnium, zirconium, titanium, tantalum, aluminum, ruthenium, palladium, platinum, cobalt, nickel, combinations thereof, or an alloy thereof. In some embodiments, the conductive material 140 is tungsten. In other embodiments, the conductive material 140 is WSi$_x$.

The gate region 130, therefore, includes the semiconductor material 128 and the conductive material 140 adjacent (e.g., overlying) the semiconductor material 128. The conductive material 140 extends over the isolation regions 136 to connect a row of active regions 110 (e.g., in the second horizontal direction Y) of adjacent capacitor structures 102 of the array. The gate region 130 is defined by gate edges 132 on opposing sides thereof parallel to the second horizontal direction Y transverse (e.g., perpendicular) to the edges 110c on the top and bottom of the active region 110 parallel to the first horizontal direction X, as shown in the top down view of FIG. 1D. In addition, field edges 142 may extend in the first horizontal direction X. In some embodiments, the field edges 142 may be substantially parallel to the edges 110c on the top and bottom of the active region 110. In particular, the field edges 142 may substantially align (e.g., coincide) with the edges 110c on the top and bottom of the active region 110. In some embodiments, the semiconductor material 128 may cover (e.g., substantially completely cover) each of the first dielectric material 114 and the second dielectric material 116 and the conductive material 140 may cover the semiconductor material 128 as well as at least a portion (e.g., substantially all) of the isolation regions 136. The gate region 130 may be formed such that the semiconductor material 128 and/or the conductive material 140 overlaps the field edges 142 without overlapping the edges 110c on opposing sides of the active region 110. Put another way, at least a portion of the peripheral region 110b may be external to (e.g., exposed) beyond the gate edges 132 that extend in the second horizontal direction Y. For example, the semiconductor material 128 may overlap (e.g., extend beyond) the active region 110 at the edges 110c on the top and bottom thereof and may underlap (e.g., terminate before) the active region 110 at the gate edges 132. Certain materials and structures (e.g., the conductive material 140, the isolation regions 136) have been omitted in the top down view of FIG. 1D for clarity.

Thus, a capacitance region of individual capacitor structures 102 may be bounded by edges 110c (e.g., field edges 142) parallel to the first horizontal direction X on two opposing sides and by the gate edges 132 on the remaining two opposing sides parallel to the second horizontal direction Y. As shown in the top down view, each of the field edges 142 and the gate edges 132 may be located within boundaries of the n-well region 108. In addition, the contacts 144 may be located external to each of the field edges 142 and the gate edges 132 and may be located within or adjacent to the edges 110c of the active region 110. For example, the contacts 144 may be located external to the edges 110c on the top and bottom of the active region 110 as well as the field edges 142 parallel to the first horizontal direction X, while additional contacts 144 may be located within the edges 110c on opposing side surfaces of the active region 110 parallel to the second horizontal direction Y. In some embodiments, the field edges 142 and/or the gate edges 132 may be self-aligned with the interface 124 between the first dielectric material 114 and the second dielectric material 116 such that the first dielectric material 114 and the gate region 130 have substantially equal widths. As described above, the first dielectric material 114 may be formed on each of the edges 110c (e.g., all four sides) of the active region 110 or may be formed on only some of the edges 110c (e.g., one side, two opposing or adjacent sides, three sides, or portions thereof) of the active region 110. While the first dielectric material 114 is illustrated as extending around the second dielectric material 116 on all sides, the first dielectric material 114 may also be formed only along opposing sides of the gate edges 132, for example, or only along opposing sides of the field edges 142. In some embodiments, the first dielectric material 114 may extend along linear portions (e.g., only) without extending to and/or around corners between adjacent sides. In other embodiments, the first dielectric material 114 may also extend around some or all corners located between adjacent linear portions.

Accordingly, a semiconductor structure comprising a capacitor structure and a gate region is disclosed. The capacitor structure comprises an active region comprising opposing field edges parallel to a first horizontal direction. The gate region comprises opposing gate edges parallel to a second horizontal direction transverse to the first horizontal direction. The semiconductor structure also comprises a first dielectric material adjacent at least one of the opposing field edges or the opposing gate edges and a second dielectric material adjacent the active area and abutting portions of the first dielectric material. Each of the first dielectric material and the second dielectric material has a height in a vertical direction transverse to the first horizontal direction and the second horizontal direction. The height of the second dielectric material in a vertical direction is less than the height of the first dielectric material.

In some embodiments, each of the semiconductor material 128 and the conductive material 140 may be individually formed adjacent the dielectric materials by deposition or other conventional processes. For example, the semiconductor material 128 may be formed (e.g., blanket deposited, CVD, ALD, etc.) over upper surfaces of the first dielectric material 114 and the second dielectric material 116 and exposed. Once the semiconductor material 128 has been formed, openings (not shown) are formed in the semiconductor material 128, in portions of the first dielectric material 114, and in designated portions of the n-well region 108 of the base material 104. The openings are formed at locations where the isolation regions 136 are ultimately to be formed. The isolation regions 136 are formed by depositing a fill material (e.g., dielectric material) in the openings. Conventional liners and/or spacer material may also be utilized. Portions of the fill material may thereafter be removed, such as by chemical-mechanical polishing (CMP) and the spacer material, if present, may be removed by wet etching or dry etching. Upon removal of the fill material in the isolation regions 136, a varied profile (e.g., topography) due to differing thicknesses of the underlying dielectric materials 114, 116 will no longer be present in the isolation regions 136 (e.g., in the intermediary region 112), but the varied topography will remain in regions containing the semiconductor material 128 due to the differing thicknesses of the underlying dielectric materials 114, 116.

Following formation of the isolation regions 136, the conductive material 140 is formed adjacent to and in contact (e.g., direct contact) with upper surfaces of the semiconductor material 128 and the isolation regions 136. The conductive material 140 may be a single material or may include a plurality of portions or materials (not shown) formed adjacent one another. For example, a liner material may be formed between the semiconductor material 128 and the conductive material 140. The conductive material 140 may be formed by a conventional deposition process, such as by chemical vapor deposition (CVD). Portions of the semiconductor material 128 and/or the conductive material 140 may be removed by conventional techniques, such as etching, to define the gate edges 132 of the gate region 130 to expose the edges 110c on opposing sides of the active region 110.

Numerous advantages are achieved by utilizing the process described above to form the semiconductor structure 100. By utilizing the interface 124 between the first dielectric material 114 and the second dielectric material 116, features formed above the dielectric materials may be self-aligned and have a substantially equal width without patterning the semiconductor material 128 and/or the conductive material 140. For example, the gate region 130 and the first dielectric material 114 may have substantially equal widths. Since the features are self-aligned, the semiconductor structure 100 may be formed using one masking act, which saves costs and additional process acts. Further, such process acts using CMP techniques, for example, may result in materials of the semiconductor material 128 and/or the conductive material 140 being minimized due to the topography of such materials following that of the underlying dielectric materials, which results in additional cost savings. To complete formation of the semiconductor structure 100 including the capacitor structures 102, additional materials may be formed on the conductive material 140 by conventional techniques, which are not described in detail herein.

Accordingly, a method of forming a semiconductor device is disclosed. The method comprises forming a first dielectric material adjacent a peripheral region of an active region of a capacitor structure, the active region comprising opposing field edges parallel to a first horizontal direction, and removing a portion of the first dielectric material from a central region of the active region. The method also comprises forming a second dielectric material adjacent the central region of the active region and abutting portions of the first dielectric material. Each of the first dielectric material and the second dielectric material has a height in a vertical direction transverse to the first horizontal direction. The height of the second dielectric material is less than the height of the first dielectric material. In addition, the method comprises forming a gate region overlying at least one of the first dielectric material and the second dielectric material. The gate region comprises opposing gate edges parallel to a second horizontal direction transverse to the first horizontal direction and the vertical direction.

FIGS. 1C and 1D show the semiconductor structure 100 after multiple process acts described above have been conducted. For example, the semiconductor structure 100 includes the semiconductor material 128 and the conductive material 140 of the capacitor structures 102 exhibiting a distinct topography as a result of such materials being self-aligned with the dielectric materials located thereunder, as shown most clearly in FIG. 1C. In addition, the differing thicknesses of the dielectric materials, including the narrow ridge of the first dielectric material 114, provides an optimized thickness of the dielectric materials such that leakage is reduced along the margins, for example, along the edges 110c of the active region 110 with minimal reduction in capacitance.

One of ordinary skill in the art will appreciate that, in accordance with additional embodiments of the disclosure, the features and feature configurations described above in relation to FIGS. 1A through 1D may be adapted to design needs of different semiconductor devices (e.g., different memory devices). By way of non-limiting example, in accordance with additional embodiments of the disclosure, FIGS. 2A through 2D show simplified, partial cross-sectional and top down views of a semiconductor structure having a different configuration than the previous semiconductor structure 100. Throughout the remaining description and the accompanying figures, functionally similar features (e.g., structures, devices) are referred to with similar reference numerals. To avoid repetition, not all features shown in the remaining figures (including FIGS. 2A through 2D) are described in detail herein. Rather, unless described otherwise below, a feature designated by a reference numeral of a previously-described feature (whether the previously described feature is first described before the present paragraph, or is first described after the present paragraph) will be understood to be substantially similar to the previously described feature.

Figure 2A:
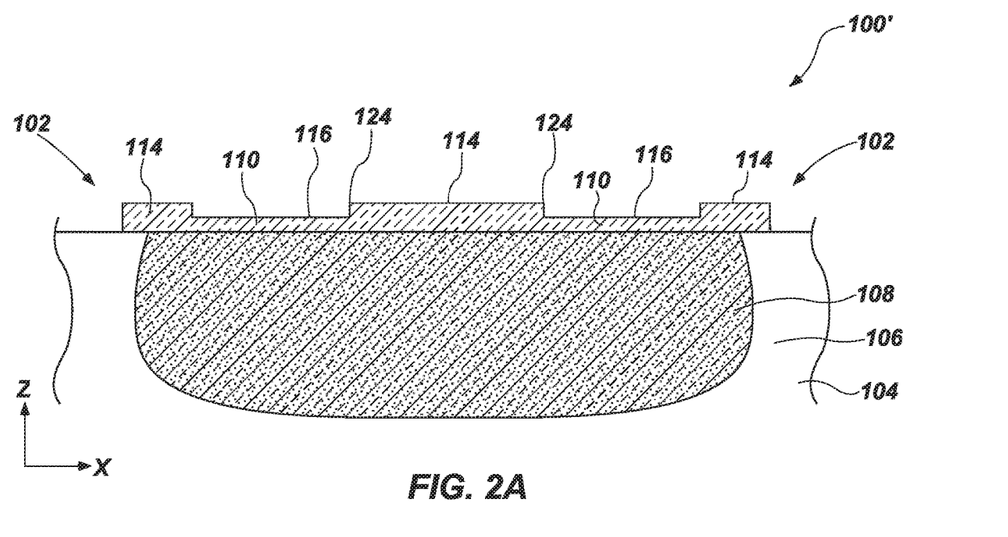
FIGS. 2A and 2C are simplified, partial cross-sectional views showing various stages of fabrication of another semiconductor structure of a semiconductor device in accordance with embodiments of the disclosure.
Figure 2B:
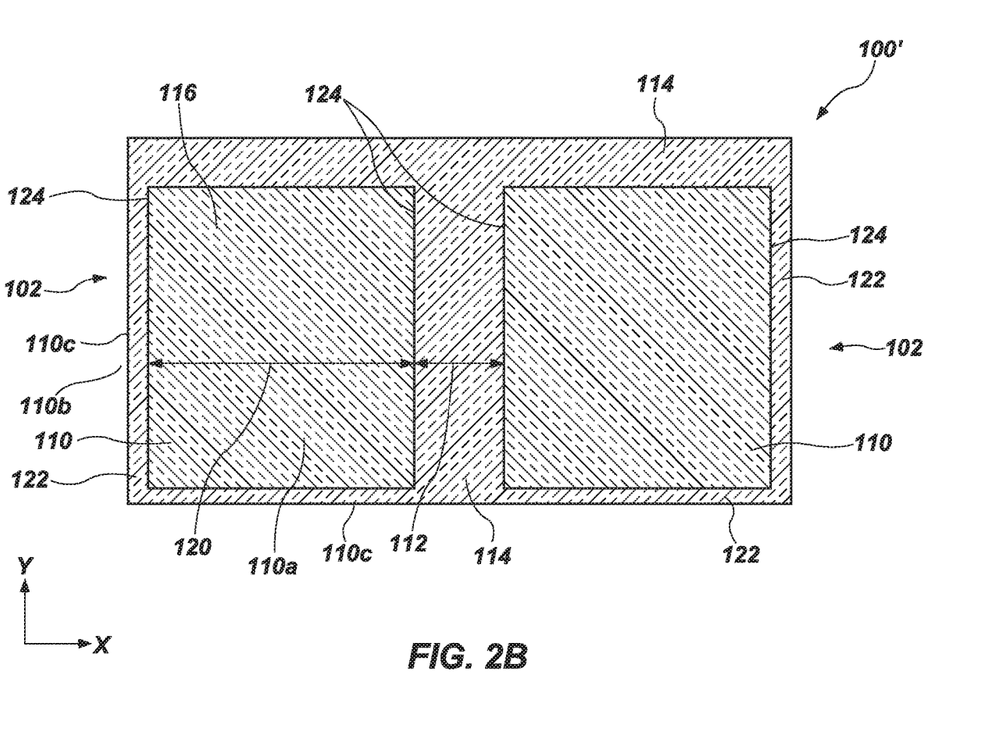
FIGS. 2B and 2D are top down views showing various stages of fabrication of the other semiconductor structure of the semiconductor device in accordance with embodiments of the disclosure.

A semiconductor structure 100' including the capacitor structures 102 is shown in FIGS. 2A and 2B. The capacitor structures 102 may also be formed adjacent (e.g., on or over) the base material 104, similar to the semiconductor structure 100 described above and depicted in FIGS. 1A and 1B. Further, the base material 104 may include the p-doped region 106 including a p-type conductivity material and the n-well region 108 including an n-type conductivity material located within the p-doped region 106. However, in the present embodiment, the first dielectric material 114 may extend across (e.g., substantially cover) all upper surfaces of the active region 110 of the capacitor structures 102 not occupied by the second dielectric material 116. In such an embodiment, the first dielectric material 114 may extend (e.g., fully extend) across substantially all of the intermediary region 112 (e.g., gap) defined by the edges 110c of the active region 110 of adjacent capacitor structures 102.

As in the previous embodiment, the second dielectric material 116 of the present embodiment may be formed in the openings 120 proximal to (e.g., directly over) the central region 110a without being formed in the blocked regions 122 in the peripheral region 110b, while the first dielectric material 114 may be formed proximal to (e.g., directly over) the peripheral region 110b of the active region 110. Put another way, the first dielectric material 114 may be formed to be adjacent (e.g., completely covering) each of the peripheral regions 110b and each of the edges 110c of the active region 110, as well as portions of at least some (e.g., each) of the intermediary regions 112 therebetween parallel to the first horizontal direction X and/or the second horizontal direction Y, without being formed adjacent the central region 110a of the respective active region 110. As shown in each of the cross-sectional view of FIG. 2A and the top down view of FIG. 2B, the first dielectric material 114 may be positioned to abut (e.g., be in direct physical contact with) the second dielectric material 116 along the interfaces 124 therebetween. Further, the dielectric materials and dimensions of the first dielectric material 114 and the second dielectric material 116 may be similar (e.g., the same) as the dielectric materials and dimensions described above with reference to FIGS. 1A and 1B, the exception being the location of the first dielectric material 114. In particular, rather than being characterized as a "narrow ridge" of a relatively thicker dielectric material surrounding a central region of a relatively thinner dielectric material, the first dielectric material 114 may fully surround the second dielectric material 116 on all sides (e.g., four sides) and cover all available regions, including the intermediary region 112 located between adjacent capacitor structures 102. Alternatively, the first dielectric material 114 may surround the second dielectric material 116 on only two opposing sides (e.g., along the gate edges 132) including the intermediary region 112 along a single direction.

As a result, the combination of the varied (e.g., differing) thicknesses of the first dielectric material 114 and the second dielectric material 116 overlying and/or proximal to the active region 110 of FIGS. 2A and 2B also provides an optimized thickness of dielectric materials such that leakage is reduced (e.g., minimized) along the margins and reliability of the semiconductor structure 100' is improved. Further, the process acts may be same as those described above with reference to FIGS. 1A and 1B. Thus, FIGS. 2A and 2B are simplified, partial cross-sectional and top down views of the semiconductor structure 100' following formation of the first dielectric material 114 and the second dielectric material 116. The resulting profile of the semiconductor structure 100' allows appropriate placement of gate materials (see FIGS. 2C and 2D) subsequently formed on the combined profile of the dielectric materials.

Figure 2C:
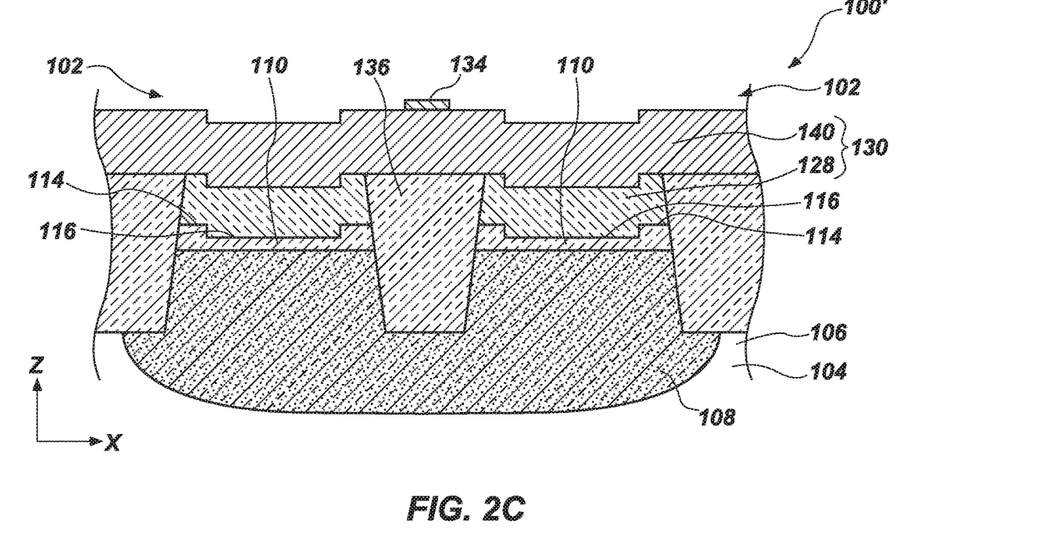
Figure 2D:
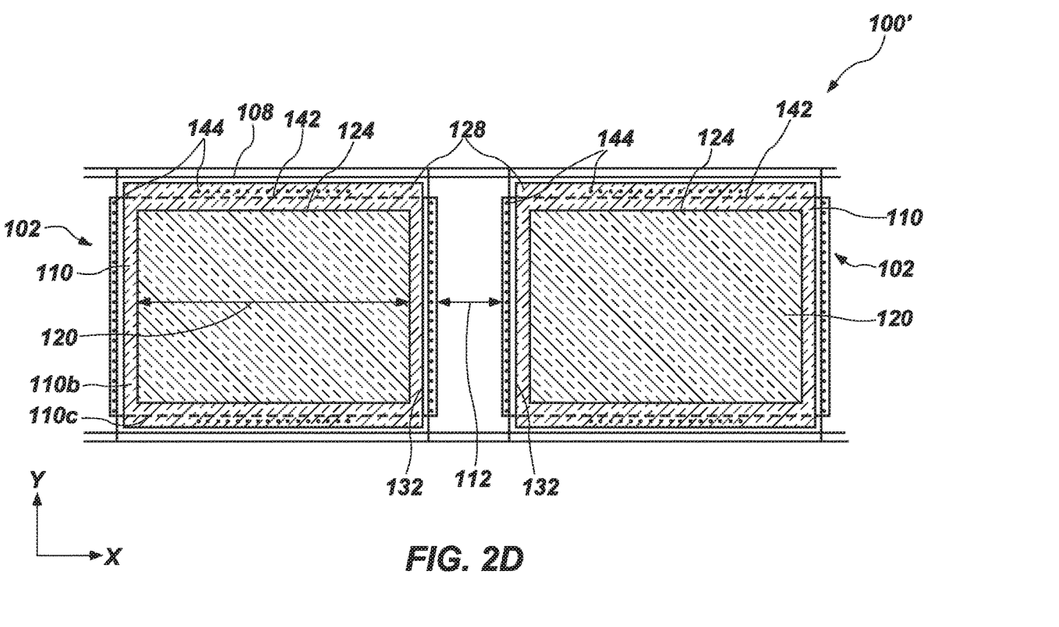

As shown in FIGS. 2C and 2D, the semiconductor material 128 is also formed adjacent to and in contact (e.g., direct physical contact) with the dielectric materials of the capacitor structures 102 of the semiconductor structure 100'. All other materials and devices, including the gate region 130, the isolation regions 136, and the conductive material 140, for example, are similar to those described above with reference to FIGS. 1C and 1D, notwithstanding locations of the first dielectric material 114 in the present embodiment. Certain materials and structures (e.g., the conductive material 140, the isolations regions 136) have been omitted in the top down view of FIG. 2D for clarity. In addition, the present embodiment is absent the region 138 (FIG. 1C) extending below a lower surface of at least some of the isolation regions 136, as shown in the cross-sectional view of FIG. 2C, due to differing processing techniques of forming the dielectric materials in the present embodiment.

Once formed, the gate region 130 is defined by the gate edges 132 as described in greater detail above with reference to FIGS. 1C and 1D. In addition, the field edges 142 may be substantially parallel to and, in some embodiments, coincide with the edges 110c on the top and bottom of the active region 110. As in the previous embodiment, the semiconductor material 128 and/or the conductive material 140 of the gate region 130 of the present embodiment may overlap the field edges 142 without overlapping the edges 110c on opposing sides of the active region 110, exposing at least a portion of the peripheral region 110b beyond the gate edges 132. In addition, placement of the contacts 144 may be similar to that described above. In the present embodiment, the field edges 142 and/or the gate edges 132 may also be self-aligned with the interface 124 between the first dielectric material 114 and the second dielectric material 116 such that the first dielectric material 114 and the gate region 130 have substantially equal widths. Further, the first dielectric material 114 may also be formed on each of the edges 110c (e.g., all four sides) of the active region 110 or may be formed on only some of the edges 110c (e.g., one side, two opposing or adjacent sides, three sides, or portions thereof) of the active region 110. For example, the first dielectric material 114 may be formed only along the gate edges 132 or only along the field edges 142.

Materials of the semiconductor material 128 and the conductive material 140 may be similar to those described above. Further, the process acts may be similar to those described above with reference to FIGS. 1C and 1D. Thus, FIGS. 2C and 2D show the resulting structure after multiple process acts described above have been conducted. For example, the resulting semiconductor structure 100' of the present embodiment includes the semiconductor material 128 and the conductive material 140 of the capacitor structures 102 exhibiting a distinct topography as a result of such materials being self-aligned with the dielectric materials located thereunder. In addition, the differing thicknesses of the dielectric materials, including the extended area of the first dielectric material 114, provides an optimized thickness of the dielectric materials such that leakage is reduced along the margins with minimal reduction in capacitance. Semiconductor devices including the capacitor structures 102 of the semiconductor structure 100' formed in accordance with embodiments of the disclosure may be formed by conducting additional process acts, which are not described in detail herein.

In use and operation, the capacitance of the capacitor structures 102 (e.g., MOS structures) depends on the applied voltage (e.g., bias) on the gate region 130. The term "applied voltage" refers to a voltage having a magnitude sufficient to charge or discharge a gate of a memory cell. The applied voltage induces a voltage differential between the gate region 130 and respective source/drain regions adjacent a memory device, such as a NAND memory device. For example, the gate region 130 may be positively biased relative to source/drain regions of the base material 104. In some embodiments, the applied voltage may be between about 1V and about 20V (e.g., 1.2V or 1.45V) and may include a bias up to a maximum voltage that may be applied to the capacitor structures 102. In other embodiments, the applied voltage may be less than or equal to 1V (e.g., 0.8V). A maximum capacitance may be directly related to a permittivity of the dielectric materials 114, 116 (e.g., oxide materials) and inversely related to a thickness (e.g., so-called "$t_{ox}$") of the dielectric materials 114, 116 located between source/drain regions of the base material 104 (e.g., body) and the gate region 130 (e.g., gate) of the capacitor structures 102. Thus, there is a desire to increase maximum capacitance as well as to reduce the dimensions of individual features of the semiconductor structures 100, 100'. However, as the thickness of the dielectric material is further scaled down to facilitate increased device density, dielectric breakdown may occur as a result of decreasing the thickness of such dielectric materials. In some systems, it may be possible to reduce a maximum voltage. However, if requirements of other components of the system require specific applied voltages, minimal thicknesses of the dielectric materials (e.g., super low-voltage materials) may result in undesirable levels of leakage. Specific placement of the first dielectric material 114 in addition to placement of the second dielectric material 116, as described above, allows the capacitor structures 102 of the semiconductor structures 100, 100' to operate without undesirable levels of leakage along the margins (e.g., perimeter). In some embodiments, the first dielectric material 114 may comprise a low-voltage oxide material and the second dielectric material 116 may comprise a super low-voltage oxide material, the second dielectric material 116 having a thickness that is less than a thickness of the low-voltage oxide material of the first dielectric material 114. By way of non-limiting example, the first dielectric material 114 may be formed at a thickness (e.g., height) of from about 50 Å to about 70 Å, such as about 64 Å (e.g., 1.45V oxide) and the second dielectric material 116 may be formed at a thickness (e.g., height) of from about 20 Å to about 45 Å, such as about 27 Å (e.g., 1.2V oxide). Such a configuration may result in a decrease in an electric field of about 50%, for example, with only a minimal decrease in capacitance.

Figure 3A:
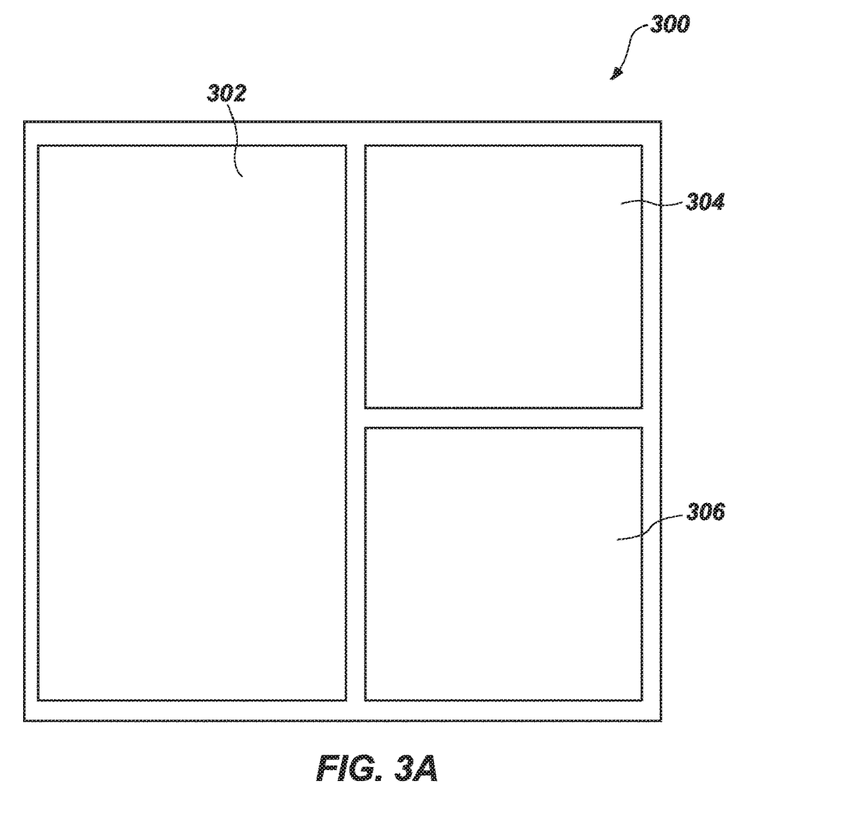
FIG. 3A is a schematic block diagram illustrating the semiconductor device comprising the semiconductor structure in accordance with embodiments of the disclosure.

Capacitors such as those shown in FIGS. 1A through 1D and 2A through 2D may be used in embodiments of semiconductor devices of the present disclosure. FIG. 3A is a block diagram of an illustrative semiconductor device 300 (e.g., a memory device) according to an embodiment of the present disclosure. The semiconductor device 300 may include at least one memory cell array 302 such as, for example, a plurality of NAND memory arrays. The semiconductor device 300 may further include at least one peripheral circuit 304 that inputs data from outside the semiconductor device 300, thus providing access to the at least one memory cell array 302. The semiconductor device 300 may further include a charge pump circuit 306 for generating an input voltage. The peripheral circuit 304 and the charge pump circuit 306 may include one or more capacitors, such as the embodiments of the capacitor structures 102 of the semiconductor structures 100, 100' shown in FIGS. 1A through 1D and 2A through 2D. The peripheral circuit 304 and charge pump circuit 306 may communicate electrically with the at least one memory cell array 302 by way of the capacitor structures 102. By providing differing thicknesses of the dielectric materials (e.g., oxide materials) within individual capacitor structures 102, the capacitor structures 102 allow the peripheral circuit 304 and the charge pump circuit 306 to withstand higher voltages with reduced leakage and to improve reliability of the semiconductor device 300. The semiconductor device 300 may, optionally, include at least one decoder.

Figure 3B:
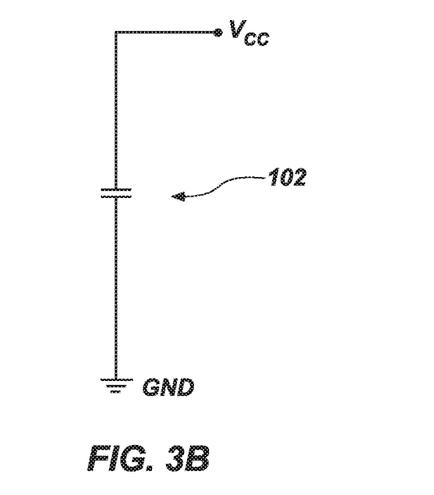
FIG. 3B is a portion of a schematic diagram of the semiconductor device of FIG. 3A.

FIG. 3B is a portion of a schematic diagram of the semiconductor device 300 of FIG. 3A. In some embodiments, the semiconductor device 300 may include one or more of the capacitor structures 102 electrically connected between a power supply electrode Vcc and a ground electrode GND, as illustrated in the simplified schematic diagram of FIG. 3B. In such an embodiment, the capacitor structures 102 may be configured to substantially reduce or substantially eliminate (e.g., filter out) electrical signals (e.g., noise) from a power supply (not shown) in so-called "quieting" circuits utilizing the capacitor structures 102. Placement of dielectric materials, as discussed in further detail above, provides an optimized thickness of the dielectric materials such that leakage of the capacitor structures 102 that are located between the power supply electrode Vcc and the ground electrode GND is reduced (e.g., minimized) and reliability of the semiconductor device 300 is improved.

Accordingly, a semiconductor device comprising an array of memory cells and a charge pump circuit comprising an array of capacitor structures is disclosed. Each capacitor structure of the array comprises an active area comprising a central portion surrounded by a peripheral portion. The capacitor structure also comprises a first dielectric material overlying at least a portion of the peripheral portion of the active area and a second dielectric material adjacent the first dielectric material and overlying the central portion of the active area. The second dielectric material has a threshold voltage magnitude that is lower than a threshold voltage magnitude of the first dielectric material. In addition, the capacitor structure comprises gates electrically connecting the active area of individual capacitor structures of the array of capacitor structures.

Figure 4:
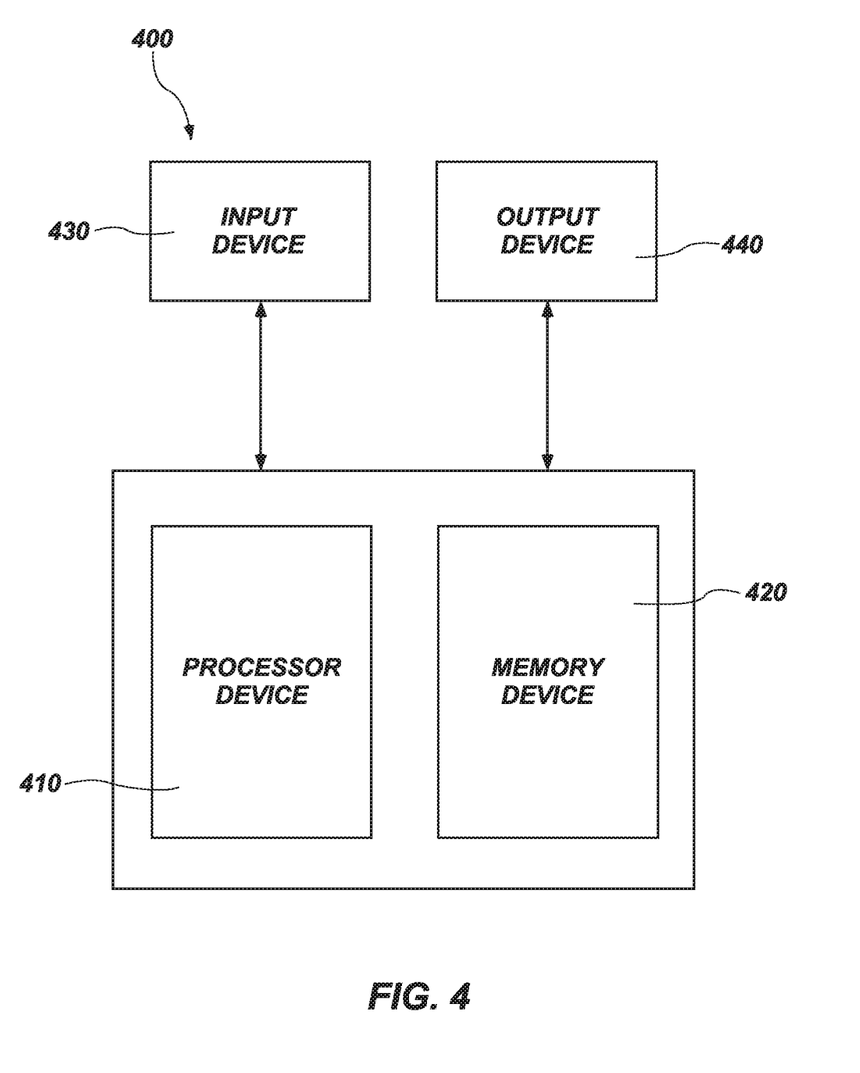
FIG. 4 is a schematic block diagram illustrating a system including semiconductor devices comprising the semiconductor structure in accordance with embodiments of the disclosure.

Semiconductor devices including device structures (e.g., the semiconductor structures 100, 100') in accordance with embodiments of the disclosure may be used in embodiments of electronic systems of the disclosure. For example, FIG. 4 is a block diagram of an illustrative electronic system 400 according to embodiments of the disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 400 includes at least one memory device 420. The memory device 420 may include, for example, an embodiment of a semiconductor device previously described herein (e.g., semiconductor structures 100, 100') previously described herein. The electronic system 400 may further include at least one electronic signal processor device 410 (often referred to as a "microprocessor"). The electronic signal processor device 410 may, optionally, include an embodiment of a semiconductor device previously described herein (e.g., the semiconductor structures 100, 100'). The electronic system 400 may further include one or more input devices 430 for inputting information into the electronic system 400 by a user, such as, for example, a mouse or other pointing device, a keyboard, a touchpad, a button, or a control panel. The electronic system 400 may further include one or more output devices 440 for outputting information (e.g., visual or audio output) to a user such as, for example, a monitor, a display, a printer, an audio output jack, a speaker, etc. In some embodiments, the input device 430 and the output device 440 may comprise a single touchscreen device that can be used both to input information to the electronic system 400 and to output visual information to a user. The input device 430 and the output device 440 may communicate electrically with one or more of the memory device 420 and the electronic signal processor device 410.

The capacitor structures 102 including the dielectric materials disclosed herein may exhibit reduced leakage along the margins and provide enhanced reliability for current transmission in 3D memory arrays, which may be suitable for use with semiconductor devices having an increased number of stacked transistors. Without being bound by any theory, leakage is known to be exponentially dependent on electric fields, therefore, increasing thicknesses of the dielectric materials in regions prone to leakage will reduce leakage exponentially. Thus, the differing (e.g., greater) thicknesses of the disclosed low-voltage dielectric materials located in strategic locations adjacent the periphery of the active region 110 of the respective capacitor structures 102 may result in reduced leakage for improved storage reliability, without unduly reducing capacitance within the system, compared to only using conventional super low-voltage dielectric materials. Thus, the capacitor structures 102 according to embodiments of the disclosure allow peripheral circuitry to operate at substantially increased voltages, while the risk of breakdown of the dielectric materials is substantially decreased or eliminated with minimal reduction in capacitance. In addition, because the features of the gate are self-aligned with the dielectric materials, such structures may be formed using one masking process, which saves costs and reduces the number of additional process acts. Further, the configuration of the dielectric materials may be applicable to all 3D memory architectures including capacitors.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
   an array of memory cells; and
   at least one charge pump circuit comprising an array of capacitors, wherein each capacitor of the array comprises:
      an active area comprising a central portion laterally surrounded by a peripheral portion;
      a first dielectric material overlying at least a portion of the peripheral portion of the active area;
      a second dielectric material abutting portions of the first dielectric material and overlying the central portion of the active area, the second dielectric material substantially fully surrounded on all sides by the first dielectric material, and the second dielectric material having a threshold voltage magnitude that is lower than a threshold voltage magnitude of the first dielectric material; and gates electrically connecting the active area of individual capacitors of the array of capacitors.

2. The electronic device of claim 1, wherein the first dielectric material exhibiting a first resistance comprises a low-voltage oxide material and the second dielectric material exhibiting a second resistance comprises a super low-voltage oxide material, the second resistance exhibited by the second dielectric material being relatively lower than the first resistance exhibited by the first dielectric material.

3. The electronic device of claim 1, further comprising isolation regions separating adjacent capacitors within the array, wherein lateral sidewalls of the isolation regions abut lateral sidewalls of the first dielectric material at a location external to an interface between the first dielectric material and the second dielectric material on individual capacitors.

4. The electronic device of claim 3, wherein one or more of the capacitors of the array are electrically connected between a power supply electrode and a ground electrode.

5. The electronic device of claim 3, wherein each of the gates comprises a conductive material overlying a polysilicon material such that gate edges of one or more of the conductive material and the polysilicon material are self-aligned with the interface between the first dielectric material and the second dielectric material.

6. The electronic device of claim 5, wherein the gate edges of each of the conductive material and the polysilicon material are self-aligned with the interface between the first dielectric material and the second dielectric material.

7. The electronic device of claim 1, wherein the second dielectric material has a lesser thickness than a thickness of the first dielectric material.

8. The electronic device of claim 1, wherein the first dielectric material and the second dielectric material comprise silicon dioxide.

9. The electronic device of claim 1, wherein the first dielectric material exhibits a threshold voltage magnitude of about 1.45V and the second dielectric material exhibits a threshold voltage magnitude of about 1.2V.

10. An electronic device, comprising:
at least one capacitor comprising an active region comprising a central region laterally surrounded by a peripheral region;
a first dielectric material overlying at least a portion of the peripheral region of the active region;
a second dielectric material overlying the central region of the active region and abutting portions of the first dielectric material, the first dielectric material laterally adjacent to and at least partially surrounding the second dielectric material, and the second dielectric material having a threshold voltage magnitude that is lower than a threshold voltage magnitude of the first dielectric material; and
isolation regions separating adjacent capacitors, outer sidewalls of the isolation regions are laterally adjacent to sidewalls of the first dielectric material.

11. The electronic device of claim 10, wherein the first dielectric material substantially fully surrounds the second dielectric material.

12. The electronic device of claim 10, wherein the first dielectric material comprises a ridge of dielectric material directly adjacent to the second dielectric material of a respective capacitor, and wherein individual regions of the first dielectric material of adjacent capacitors are isolated from one another.

13. The electronic device of claim 10, wherein the first dielectric material extends between the second dielectric material of adjacent capacitors such that all intermediary regions between respective active regions of the adjacent capacitors are substantially fully covered with the first dielectric material.

14. The electronic device of claim 10, further comprising a base material underlying the at least one capacitor, wherein portions of the isolation regions extend beyond a plane of upper surfaces of the first dielectric material on a side of the at least one capacitor opposite the base material.

15. A system, comprising:
a processor operably coupled to an input device and an output device; and
an electronic device operably coupled to the processor, the electronic device comprising:
a capacitor comprising an active region comprising opposing field edges parallel to a first horizontal direction;
a gate region comprising opposing gate edges parallel to a second horizontal direction, transverse to the first horizontal direction;
a first dielectric material overlying the active region and adjacent to one or more of the opposing field edges and the opposing gate edges;
a second dielectric material overlying the active region and isolated from the opposing field edges and the opposing gate edges, the first dielectric material directly contacting and at least partially surrounding the second dielectric material on at least three sides, and a resistance of the second dielectric material is relatively lower than a resistance of the first dielectric material; and
isolation regions separating adjacent capacitors, lateral sidewalls of the isolation regions abutting lateral sidewalls of the first dielectric material.

16. The system of claim 15, wherein the gate region comprises a semiconductor material and a conductive material overlying the semiconductor material, the opposing gate edges of one or more of the conductive material and the semiconductor material are self-aligned with an interface between the first dielectric material and the second dielectric material.

17. The system of claim 16, wherein the lateral sidewalls of the isolation regions abut lateral sidewalls of the semiconductor material of the gate region, and upper surfaces of the isolation regions abut lower surfaces of the conductive material of the gate region.

18. The system of claim 15, wherein a thickness of the second dielectric material is about one-half of a thickness of the first dielectric material.

19. The system of claim 15, further comprising contacts located on opposing peripheral edges of the active region and external to the opposing gate edges of the gate region.

20. The system of claim 15, wherein the active region comprises a central region laterally surrounded by a peripheral region, the first dielectric material overlying at least a portion of the peripheral region of the active region, and the second dielectric material overlying the central region of the active region.

* * * * *

UNITED STATES PATENT AND TRADEMARK OFFICE
CERTIFICATE OF CORRECTION

PATENT NO. : 11,374,132 B2
APPLICATION NO. : 17/087842
DATED : June 28, 2022
INVENTOR(S) : Michael A. Smith Page 1 of 1

It is certified that error appears in the above-identified patent and that said Letters Patent is hereby corrected as shown below:

In the Specification
Column 8, Line 1, change "silicon dioxide (Sift)," to --silicon dioxide ($SiO_2$),--

Signed and Sealed this
Twenty-seventh Day of September, 2022

Katherine Kelly Vidal
*Director of the United States Patent and Trademark Office*